United States Patent
Lohmeyer et al.

(10) Patent No.: US 7,041,342 B2
(45) Date of Patent: May 9, 2006

(54) THIN-FILM SOLAR CELLS AND METHOD OF MAKING

(75) Inventors: Manfred Lohmeyer, Nackenheim (DE); Stefan Bauer, Alzey (DE); Burkhard Danielzik, Bingen (DE); Wolfgang Möhl, Worms (DE); Nina Freitag, Wallertheim (DE)

(73) Assignee: Schott Glas, Mainz (DE)

( * ) Notice: Subject to any disclaimer, the term of this patent is extended or adjusted under 35 U.S.C. 154(b) by 0 days.

(21) Appl. No.: 10/683,088

(22) Filed: Oct. 10, 2003

(65) Prior Publication Data

US 2004/0082097 A1  Apr. 29, 2004

Related U.S. Application Data

(60) Division of application No. 10/056,802, filed on Jan. 25, 2002, now Pat. No. 6,670,543, which is a continuation-in-part of application No. PCT/EP00/07082, filed on Jul. 25, 2000.

(30) Foreign Application Priority Data

Jul. 26, 1999 (DE) ................ 199 35 046

(51) Int. Cl.
*C23C 16/56* (2006.01)
*C23C 16/24* (2006.01)
*C23C 16/515* (2006.01)

(52) U.S. Cl. .............. 427/595; 427/585; 427/586; 427/588; 427/596; 427/74; 427/58; 438/97; 438/492; 438/493; 438/507

(58) Field of Classification Search .............. 427/585, 427/586, 588, 595, 596, 74, 58; 438/97, 438/492, 493, 507
See application file for complete search history.

(56) References Cited

U.S. PATENT DOCUMENTS

| | | | | |
|---|---|---|---|---|
| 4,814,842 A | * | 3/1989 | Nakagawa et al. | 257/65 |
| 5,242,530 A | * | 9/1993 | Batey et al. | 117/90 |
| 5,387,542 A | * | 2/1995 | Yamamoto et al. | 438/487 |
| 5,456,763 A | * | 10/1995 | Kaschmitter et al. | 136/258 |
| 5,618,758 A | * | 4/1997 | Tomita et al. | 438/485 |
| 5,624,873 A | * | 4/1997 | Fonash et al. | 438/487 |
| 6,440,824 B1 | * | 8/2002 | Hayashi et al. | 438/486 |
| 6,670,543 B1 | * | 12/2003 | Lohmeyer et al. | 136/258 |
| 2002/0022349 A1 | * | 2/2002 | Suguyama et al. | 438/485 |
| 2005/0022864 A1 | * | 2/2005 | Fujioka et al. | 136/258 |

FOREIGN PATENT DOCUMENTS

| | | | |
|---|---|---|---|
| JP | 4-127580 A | * | 4/1992 |
| JP | 6-140327 A | * | 5/1994 |
| JP | 6-291061 A | * | 10/1994 |

(Continued)

OTHER PUBLICATIONS

Wohllebe et al, Journal of Non-Crystalline Solids, vol. 227-230, pp. 925-929, (1998).*

(Continued)

*Primary Examiner*—Alan Diamond
(74) *Attorney, Agent, or Firm*—Nils H. Ljungman & Associates

(57) ABSTRACT

There are now provided thin-film solar cells and method of making. The devices comprise a low-cost, low thermal stability substrate with a semiconductor body deposited thereon by a deposition gas. The deposited body is treated with a conversion gas to provide a microcrystalline silicon body. The deposition gas and the conversion gas are subjected to a pulsed electromagnetic radiation to effectuate deposition and conversion.

20 Claims, 3 Drawing Sheets

FOREIGN PATENT DOCUMENTS

JP  10-291897 A  * 11/1998
JP  10-313125 A  * 11/1998

OTHER PUBLICATIONS

Roca et al, Thin Solid Films, vol. 337, pp. 23-26, (1999).*
Roca et al, Journal of Applied Physics, vol. 86, No. 12, pp. 7079-7082, (Dec. 15, 1999).*
Homma et al, Proceedings of the 2003 International Microprocesses and Nanotechnology Conference, pp. 48-49, (Oct. 29-31, 2003).*

Matsuda et al, "Growth mechanism of microcrystalline silicon obtained from reactive plasmas," Thin Solid Films, vol. 337, issues 1-2, pp. 1-6, Feb. 24, 1999.*

Asano, "Effects of hydrogen atoms on the network structure of hydrogenated amorphous and microcrystalline silicon thin films," Appl. Phys. Lett., vol. 58(6), pp. 533-535, Feb. 5, 1990.*

* cited by examiner

THIN-FILM SOLAR CELLS AND METHOD OF MAKING

CONTINUING APPLICATION DATA

This application is a divisional application of U.S. Ser. No. 10/056,802, filed on Jan. 25, 2002, now U.S. Pat. No. 6,670,543, which is a Continuation-in-Part application of International Application No. PCT/EP00/07082, filed on Jul. 25, 2000, and claiming priority from Federal Republic of Germany Patent Application No. 199 35 046.9, filed on Jul. 26, 1999. International Application No. PCT/EP00/07082 was pending as of the filing date of this application. The United States was an elected state in International Application No. PCT/EP00/07082.

BACKGROUND OF THE INVENTION

1. Field of the Invention

The invention relates to thin-film solar cells and method of making.

2. Background Information

Photovoltaic (PV) cells are made of materials referred to as semiconductors, such as, silicon, which is currently the most commonly used. Basically, when light strikes the cell, a certain portion of it is absorbed within the semiconductor material. This means that the energy of the absorbed light is transferred to the semiconductor. The energy impacts the electrons, allowing them to flow freely. PV cells also all have one or more electric fields which act to force electrons freed by light absorption to flow in a certain direction. This flow of electrons is a current, and by placing metal contacts on the top and bottom of the PV cell, one can draw that current off to use externally. For example, the current can power a calculator. This current, together with the cell's voltage (which is a result of its built-in electric field or fields), defines the power that the solar cell can produce.

A display screen made with TFT (thin-film transistor) technology is a liquid crystal display (LCD), common in notebook and laptop computers, that has a transistor for each pixel (that is, for each of the tiny elements that control the illumination of your display). Having a transistor at each pixel means that the current that triggers pixel illumination can be smaller and therefore can be switched on and off more quickly. TFT technology is also known as active matrix display technology (and contrasts with "passive matrix" which does not have a transistor at each pixel). A TFT or active matrix display is more responsive to change. For example, when you move your mouse across the screen, a TFT display is fast enough to reflect the movement of the mouse cursor. (With a passive matrix display, the cursor temporarily disappears until the display can "catch up.") Active matrix (also known as Thin Film Transistor or thin film transistor) is a technology used in the flat panel liquid crystal displays of notebook and laptop computers. Active matrix displays provide a more responsive image at a wider range of viewing angle than dual scan (passive matrix) displays.

In this context, an Si:H film is a film of silicon in which hydrogen is incorporated. The hydrogen content is approximately 3 to 20%.

Solar cells based on the semiconductor material silicon have been known for many years. These solar cells are usually produced from solid monocrystalline or polycrystalline silicon, typical thicknesses of a solar cell of this type being approximately 300 to 500 µm. These thicknesses are required firstly in order to ensure sufficient mechanical stability and secondly to achieve absorption of the incident sunlight which is as complete as possible. On account of the relatively large film thicknesses and the associated high consumption of material, and on account of the unavoidable need for a high-temperature step for doping of the silicon wafers (T≧1000° C.), solar cells of this type entail expensive manufacture.

As an alternative to these relatively thick silicon solar cells described above, in addition to the thin film solar cells based on amorphous Si:H (referred to below as a-Si:H), which have already been the subject of research for some 20 years, thin-film solar cells made from microcrystalline Si:H (referred to below as µc-Si:H) have in recent years become an established subject for investigation. This cell material is expected to have a similarly high efficiency to that of monocrystalline silicon, but to involve less expensive production processes, as are also known for a-Si:H. At any rate, the use of µc-Si:H is supposed to suppress the degradation in the efficiency under intensive illumination, which is inevitable when using a-Si:H. However, a number of significant points still currently stand in the way of commercial utilization of µc-Si:H as the functional layer in a thin-film solar cell. Unlike the solar cell using a-Si:H, which has a thickness of the photovoltaically active film of approximately 300 nm, the solar cell made from µc-Si:H, to achieve a similarly good utilization of the incident light, must be approximately 3000 nm thick, i.e. has to be thicker by a factor of 10. Therefore, an economic process must also allow the deposition rate of the microcrystalline material to be higher by this factor than that achieved for a-Si:H. An inexpensive substrate, preferably window glass or even standard plastics, appears to be indispensable as a further necessary feature for commercial utilization of the µc-Si:H. For this purpose, it is necessary to have available deposition methods which are compatible with the substrates, i.e. low-temperature processes (T<100° C. for plastic or T≦200 to 300° C. for glass which is provided with a transparent conductive film), and these processes must moreover still achieve high film-generation rates.

According to the prior art, microcrystalline silicon (µc-Si:H) can be applied in thin films to a support material at temperatures of greater than approximately 200° C. using various processes. For example, it can be deposited directly from the gas phase. By way of example, the following deposition methods are known: high-frequency glow discharge deposition (HF-PECVD), electron cyclotron resonance (ECR) process, electron cyclotron wave resonance (ECWR) process, sputter deposition, hot-wire (HW) technique, microwave CVD.

Furthermore, processes are also known in which µc-Si:H is produced by initially depositing a-Si:H from the gas phase, which is then transformed into µc-Si:H. The transformation of a-Si:H to µc-Si:H is known, for example, from the following documents.

For example, U.S. Pat. No. 5,470,619 describes the transformation of a-Si:H into µc-Si:H by means of heat treatment at a temperature of 450° C. to 600° C.

U.S. Pat. No. 5,486,237 describes a temperature-induced transformation of a-Si:H films into µc-Si:H films at 550° C. to 650° C. over a period of 3 to 20 hours.

U.S. Pat. No. 5,344,796 describes a process for producing a thin µc-Si:H film on a glass substrate. In this process, first of all a µc-Si:H film is generated on the substrate and serves as a seed layer, then a-Si:H is deposited on this seed layer by means of a CVD process. The a-Si:H is transformed into µc-Si:H by means of a heat treatment, preferably at between 580° C. and 600° C. for a period of from 20 to 50 hours.

U.S. Pat. No. 5,693,957 likewise describes the thermal transformation of a-Si:H films into μc-Si:H films at 600° C., the transformation of certain a-Si:H films into μc-Si:H being deliberately prevented by impurities formed by these a-Si:H films.

A microwave plasma CVD process for the production of a-Si:H and μc-Si:H films is described in U.S. Pat. No. 5,334,423, in which, in saturation mode, 100% of the microwave power is introduced.

Published International Application No. 93/13553 (corresponding to U.S. Pat. No. 5,231,048) describes a microwave CVD process for producing thin semiconductor films, the process pressure lying below the Paschen minimum. A microwave CVD process with controllable bias potential for the production of thin semiconductor films is described in document U.S. Pat. No. 5,204,272.

The production of μc-Si:H films by means of a microwave CVD process is described in U.S. Pat. No. 4,891,330, in which preferably at least 67% of hydrogen is added to the process or precursor gas in order to assist the formation of the μc-Si:H phase.

A plasma process for the production of a μc-Si:H layer is described in document Published International Application No. 97/24769 (corresponding to U.S. Pat. No. 6,309,906), the precursor gas being diluted with hydrogen and/or argon.

Furthermore, a plasma treatment of an a-Si:H film by means of an argon plasma is described in U.S. Pat. No. 4,762,803, and by means of a hydrogen plasma in Published International Application No. 93/10555 (corresponding to U.S. Pat. No. 5,387,542), in order to obtain a μc-Si:H film.

European Patent No. 0 571 632 A1 (corresponding to U.S. Pat. No. 5,387,542) has disclosed a plasma CVD process for producing a polycrystalline Si film on a substrate. For this purpose, firstly a thin, amorphous Si:H film is produced on the substrate by plasma-assisted CVD coating. Then, the amorphous Si:H film is subjected to a plasma-assisted treatment using a hydrogen plasma, the amorphous Si:H film being transformed into the ploycrystalline Si:H film.

Plasma-enhanced CVD coating in pulsed mode for the production of an amorphous Si:H film on a substrate is known from U.S. Pat. No. 5,618,758.

Furthermore, it is also possible to produce a μc-Si:H film by alternating deposition of a-Si:H films and subsequent treatment of this film using a hydrogen plasma. This process is generally referred to in the literature as the layer-by-layer (LBL) technique. The process by which the a-Si:H is transformed into μc-Si:H at atomic level has not to date been unambiguously explained (there are several models under discussion), but a competition process between the etching away of disadvantageous Si—Si bonds and hydrogen-induced restructuring of the network toward the crystalline phase, which is more favorable in energy terms, seems very likely.

Parameters which provide good a-Si:H films, i.e. those which are suitable for components, are often used for the deposition of the a-Si:H film. The thicknesses of the individual films which are reported in the literature typically lie between 1.4 nm and several 10 s of nm. On account of this relatively great variation in film thickness, the result is aftertreatment, or post-treatment, times using an $H_2$ plasma which lie in the range from a few seconds to several minutes. The deposition processes used are HF-PECVD processes, in which, on account of the low excitation frequency, the deposition rates are relatively low.

HF-PECVD processes at most achieve maximum deposition rates (film thickness actually deposited divided by the time required for this deposition) which are significantly below 10 nm/min.

The following text provides literature references which represent the prior art of μc-Si:H deposition by means of the LBL technique:

Asano, A.; Appl. Phys. Lett. 56 (1990) 533;

Jin Jang; Sung Ok Koh; Tae Gon Kim; Sung Chul Kim, Appl. Phys. Lett. 60 (1992) 2874;

Otobe, M.; Oda, S.; Jpn. J. Appl. Phys. 31 (1992) 1948;

Kyu Chang Park, Sung Yi Kim; Min Park; Jung Mok Jun; Kyung Ha Lee; Jin Jang; Solar Energy Materials and Solar Cells, Vol. 34 (1994), 509;

Hapke, P.; Carius, R.; Finger, F.; Lambertz, A.; Vetterl, O.; Wagner H.; Material Research Society Symposium Proceedings, Vol. 452; (1997), 737.

All the processes which have been used to date for the LBL technique give very low effective deposition rates (1–6 nm/min), which restrict commercial application. Furthermore, in the LBL processes which have been used to date, the individual film thicknesses (1 nm to a few 10 s of nm) cannot reliably be set with accuracy without a complex in situ measurement technique. This variation from the first step of the process is reflected in the second step. The result in particular is that the duration of the second step ($H_2$ plasma treatment) cannot be determined with accuracy in advance. This means that the process is dependent on an inherent stability which cannot be achieved on an industrial scale.

Measures aimed at increasing the rate, for example by increased introduction of power (higher plasma densities) lead to an increase in the particle fraction in the film and therefore to a reduction in quality.

The literature and the abovementioned documents describe relatively high process temperatures (250–330° C.), which are evidently required in order to ensure sufficient film qualities (compact, i.e. dense films) and to ensure film adhesion. Therefore, thermolabile substrates cannot be coated.

OBJECT OF THE INVENTION

In accordance with one object of the invention there is to be provided a solar cell having a low-cost, low thermal stability substrate.

In accordance with another object of the invention there is to be provided a thin-film transistor having a low-cost, low thermal stability substrate.

Working on this basis, the present invention, in at least one aspect, is also based on the object of providing a plasma CVD process and a plasma CVD device for the production of a microcrystalline Si:H film on a substrate, in which the microcrystalline Si:H film is produced by treating an amorphous Si:H film using a hydrogen plasma. The intention is to produce a high-quality microcrystalline Si:H film on a substrate at low cost and with high deposition rates. It is to be possible to set and regulate the film thickness and composition in a controlled manner, and production is to take place with the minimum possible heating of the substrate.

SUMMARY OF THE INVENTION

According to one aspect of the invention, there is provided a thin-film solar cell, comprising: a transparent substrate having a first surface configured to receive incident light and a second surface opposite said first surface; a first electrode having a first surface and a second surface opposite said first surface; said first electrode comprising an electrically conductive layer of a transparent conductive material; a microcrystalline hydrogenated silicon semiconductor body; said microcrystalline hydrogenated silicon semiconductor body having a first surface and a second surface opposite said first surface; said microcrystalline hydrogenated silicon semiconductor body being disposed with said first surface thereof on said second surface of said first electrode; said microcrystalline hydrogenated silicon semiconductor body originated from a continuous-gas-flow, pulsed-electromagnetic-radiation-excited plasma, plasma-enhanced chemical vapor deposited, continuous-gas-flow, pulsed-electromagnetic-radiation-excited, hydrogen-plasma-enhanced-treated amorphous hydrogenated silicon body; said second surface of said first electrode comprising a surface configured to accept said microcrystalline hydrogenated silicon semiconductor body; said microcrystalline hydrogenated silicon semiconductor body comprising at least one semiconductor layer; at least one of each said at least one semiconductor layer having a thickness of from about one tenth of a nanometer to about fifty nanometers; a second electrode having a first surface and a second surface opposite said first surface; said second electrode being disposed with said first surface thereof on said second surface of said microcrystalline hydrogenated silicon semiconductor body; a first conductor element connected to said first electrode; and a second conductor element connected to said second electrode; said first conductor element and said second conductor element being configured and disposed to lead electricity from said solar cell; said substrate having a predetermined heat stability; said predetermined heat stability being sufficiently great to permit manufacture of a thin-film solar cell and said predetermined heat stability being sufficiently low to minimize cost.

In accordance with another aspect of the invention there is provided a thin-film transistor, comprising: a substrate having a first surface and a second surface opposite said first surface; a microcrystalline hydrogenated silicon semiconductor body; said microcrystalline hydrogenated silicon semiconductor body having a first surface and a second surface opposite said first surface; said microcrystalline hydrogenated silicon semiconductor body being disposed with said first surface thereof on said second surface of said substrate; said microcrystalline hydrogenated silicon semiconductor body originated from a continuous-gas-flow, pulsed-electromagnetic-radiation-excited plasma, plasma-enhanced chemical vapor deposited, continuous-gas-flow, pulsed-electromagnetic-radiation-excited, hydrogen-plasma-enhanced-treated amorphous hydrogenated silicon body; said microcrystalline hydrogenated silicon semiconductor body comprising at least one semiconductor layer; at least one of each said at least one semiconductor layer having a thickness of from about one tenth of a nanometer to about fifty nanometers; said microcrystalline hydrogenated silicon semiconductor body comprising a source layer and a drain layer; a plurality of insulating films disposed on said microcrystalline hydrogenated silicon semiconductor body; said plurality of insulating films comprising a first insulating film, a second insulating film, and a third insulating film; a gate electrode disposed on said first insulating film; a source electrode disposed on said second insulating film; a drain electrode disposed on said third insulating film; said substrate comprising a predetermined heat stability; said predetermined heat stability being sufficiently great to permit manufacture of a thin-film transistor and said predetermined heat stability being sufficiently low to minimize cost.

In accordance with one aspect of the invention there is provided a process for providing a microcrystalline hydrogenated silicon semiconductor body on a substrate, such as, a substrate for a thin-film solar cell, or a substrate for a thin-film transistor, said process comprising: providing a substrate, said substrate having a first surface and a second surface opposite said first surface; flowing a plasma-enhanced chemical vapor deposition gas over said second surface of said substrate to deposit a body of amorphous hydrogenated silicon on said second surface of said substrate; flowing a plasma-enhanced, hydrogen-plasma containing conversion gas over said deposited body of amorphous hydrogenated silicon to convert said deposited body of amorphous hydrogenated silicon into a body of microcrystalline hydrogenated silicon; said flowing of said deposition gas and said flowing of said conversion gas comprising at least one of: (a.), (b.), (c.), and (d.): (a.) continuously flowing said plasma-enhanced chemical vapor deposition gas over said second surface of said substrate to deposit said body of amorphous hydrogenated silicon on said second surface of said substrate; (b.) continuously flowing said plasma-enhanced, hydrogen-plasma containing conversion gas over said body of amorphous hydrogenated silicon to convert said deposited body of amorphous hydrogenated silicon into a body of microcrystalline hydrogenated silicon; (c.) exposing said plasma-enhanced chemical vapor deposition gas to a pulsed electromagnetic radiation with a sufficient radiation intensity to excite said plasma contained in said plasma-enhanced chemical vapor deposition gas thus depositing said deposited body of amorphous hydrogenated silicon on said second surface of said substrate; (d.) exposing said plasma-enhanced, hydrogen-plasma conversion gas to a pulsed electromagnetic radiation with a sufficient radiation intensity to excite said plasma contained in said plasma-enhanced, hydrogen-plasma conversion gas to thus effectuate conversion of said amorphous hydrogenated silicon body into said deposited body of microcrystalline hydrogenated silicon; and said method further comprising: attaching at least two electrode means to said body of microcrystalline hydrogenated silicon and forming one of: a thin-film solar cell, or a thin-film transistor.

According to one aspect of the invention, to achieve this object, there is proposed a plasma CVD process for the production of a microcrystalline Si:H film on a substrate, comprising the following steps:

1.1 plasma-enhanced CVD coating of the substrate with at least one thin amorphous Si:H film, 1.2 plasma-enhanced treatment of the amorphous Si:H film using a hydrogen plasma, the amorphous Si:H film being transformed into a microcrystalline Si:H film, and 1.3 repeating the steps 1.1 and 1.2 if necessary which is characterized in that the coating or the treatment is carried out with a continuous flow of the coating gases or the treatment gases and using pulsed electromagnetic radiation which excites the plasma.

With regard to the device, the object is achieved, according to one aspect of the invention, by the fact that a device for producing a microcrystalline Si:H film on a substrate using a plasma CVD process is provided, in which an amorphous Si:H film is deposited in pulse-induced manner on the inner surfaces of the device, in particular on the inner surfaces of the deposition chamber.

Plasma impulse CVD processes are known and are described, for example, in Journal of the Ceramic Society of Japan, 99 (10), 894–902 (1991), this document being hereby incorporated by reference as if set forth in its entirety herein. In these processes, generally with a continuous flow of the coating gases, the electromagnetic radiation which excites the plasma is supplied in pulsed form, a thin film (typically of $\geqq 0.1$ nm) being deposited on the substrate on each pulse. The fact that each power pulse is followed by a pulse pause means that even substrates which are not thermally stable can be exposed to high powers during a pulse. This means in particular that high coating rates are possible without imposing significant thermal loads on the substrate.

Therefore, the plasma CVD process according to one aspect of the invention for the first time allows very rapid, inexpensive production of high-quality, microcrystalline Si:H films on a substrate. The film thickness and the composition of the Si:H film can be set and regulated reproducibly. The film is produced with very minor heating of the substrate.

The amorphous Si:H film is preferably deposited in individual film assemblies, it being possible to produce film assemblies comprising 1 to 50, particularly 1 to 5 a-Si:H monolayers per pulse.

The film thickness of a film assembly can in this case be set reproducibly. Under otherwise constant conditions, a defined film thickness of a-Si:H is always deposited on each pulse. It is in this way possible to set a multiple of the film thickness of a film assembly by simply counting the number of pulses. The film thickness of a film assembly can for this purpose be determined experimentally on a one-off basis. In other words, there need to be only one experimental determination of the film thickness of a film assembly.

With a predetermined or gettable film thickness of the a-Si:H film, the pulse-induced treatment duration with the hydrogen plasma can also easily be predetermined experimentally and therefore accurately defined.

After each pulse and therefore deposition of an a-Si:H film assembly, the coating gas is preferably changed very quickly, i.e. the gas is discharged and a new coating gas is passed into the deposition chamber.

The first film layers applied to the substrate are preferably deposited in the form of a degressive gradient with an elevated, inherent microcrystalline Si:H content. A preferred process for the production of a gradient film is described in German Patent No. 44 45 427 C2 (corresponding to U.S. Pat. No. 5,643,638). The fact that the first film already has a certain amount of μc-Si:H means that the subsequent transformation from a-Si:H to μc-Si:H is significantly quicker and easier, since the crystalline formation is present in the first film layers.

This eliminates the need for further gradient films to be produced. Since this procedure is highly time-consuming and complex, after a gradient film containing μc-Si:H has been produced once, the process is switched in such a way that subsequently only a-Si:H is deposited, and this material is transformed into μc-Si:H.

Preferably, in each case a thin, amorphous Si:H film which is from 0.1 to 5 nm thick is deposited and is then transformed into μc-Si:H, with a duration of a pulse of the electromagnetic radiation of $\geqq 0.1$ ms and a pulse pause of the electromagnetic radiation—i.e. the pause between two pulses—of $\leqq 200$ ms being set.

The treatment time using the pulsed hydrogen plasma is preferably set at up to 30 seconds, in particular at up to 10 seconds.

Overall, a microcrystalline Si:H film which is up to 5000 nm thick is produced on the substrate; greater thicknesses are possible without any restrictions.

The PICVD process can be carried out using alternating voltage pulses with a frequency of between approximately 50 kHz and 300 GHz. On account of the high coating rate and the possibility of working within a relatively broad pressure range (0.001 to approximately 10 mbar), microwave frequencies are particularly suitable; of these frequencies, the 2.45 GHz frequency is preferred as the industrial frequency, since the corresponding microwave components are readily available at low cost. As a further advantage, the pulse process offers the possibility of shaping the pulse itself, and in this way further influencing properties of the thin film which is deposited by a single plasma pulse in terms of the film growth direction. At a pressure of 0.1–2 mbar, an excitation frequency of 2.45 GHz, pulse durations are between 0.1 and 2 ms and pulse pauses of between 5 and $\leqq 200$ ms have proven particularly suitable for the production of the types of film according to one aspect of the invention. If the reaction times in the plasma are very short, pulse durations of 0.01 ms may be appropriate; however, the use of such short pulses is often restricted by equipment considerations (pulse rise time). The recommended range for the pulse amplitude cannot be stated numerically; the minimum value is that value at which the discharge can still just be initiated with the particular coating gas and the other process parameters, and the maximum value is given by the capacity of the particular pulse generator used.

The procedure for producing the gradient layer will as a rule be such that the dependence of the layer properties and/or compositions on the pulse duration, pulse amplitude and pulse pause are determined in a series of preliminary experiments and, during the actual production of the gradient film, this parameter is controlled in such a way that the desired gradient is formed in the film growth direction. The accuracy with which the gradient must be fixed beforehand depends on the demands imposed on the layer. With the process according to one aspect of the invention, it is possible without difficulty to vary, for example, the composition of the film on the substrate in the film growth direction from monolayer to monolayer.

A mean microwave power of 150 mW/cm$^3$ to 1500 mW/cm$^3$ is preferably used.

The amorphous Si:H film is preferably deposited from a coating gas which contains at least one Si-organic film-forming agent, the coating gas used being a silane, in particular SiH$_4$ or a chlorosilane, and a process pressure in the range from 0.1 to 1 mbar being set. Even at high deposition rates, i.e. a relatively high process pressure and a high pulse power, contrary to expectation no dust or powder formation was observed in the film.

It is particularly advantageous if the coating gas is changed very quickly after each a-Si:H film. Very rapid gas change times (<10 ms) makes the process particularly economical, and it is possible to reproducibly produce μc-Si:H films of settable thickness and quality.

Hydrogen may be added to the coating gas.

The process according to one aspect of the invention is preferably carried out in such a manner that the substrate temperature does not exceed 200° C., in particular 100° C., and particularly preferably 50° C.

According to the process according to the invention, it is advantageously possible to set conductivities of the μc-Si:H film of from 10$^{-7}$ S/cm to 10 S/cm, the conductivities if appropriate being adjusted by doping with foreign atoms, for example by means of the coating gas.

In this case, it is preferable to produce an n-doped, p-doped or undoped μc-Si:H film. Particularly for the production of thin-film solar cells, it is necessary to produce a plurality of different μc-Si:H films on top of one another on a substrate.

The substrate used is preferably a glass, a glass ceramic or a plastic, the substrate particularly preferably being provided with a transparent, conductive film, in particular an ITO film, a doped SnO₂ film or a doped ZnO film.

A μc-Si:H film on a substrate which has been produced using the process according to one aspect of the invention is preferably used as a component of a thin-film solar cell or as a component of a thin-film transistor (TFT).

The above-discussed embodiments of the present invention will be described further hereinbelow. When the word "invention" is used in this specification, the word "invention" includes "inventions", that is the plural of "invention". By stating "invention", the Applicants do not in any way admit that the present application does not include more than one patentably and non-obviously distinct invention, and maintains that this application may include more than one patentably and non-obviously distinct invention. The Applicants hereby assert that the disclosure of this application may include more than one invention, and, in the event that there is more than one invention, that these inventions may be patentable and non-obvious one with respect to the other.

BRIEF DESCRIPTION OF THE DRAWINGS

The following exemplary embodiment and the drawings are intended to explain the invention in more detail. In the drawings.

DESCRIPTION OF THE PREFERRED EMBODIMENT

Figure 1:
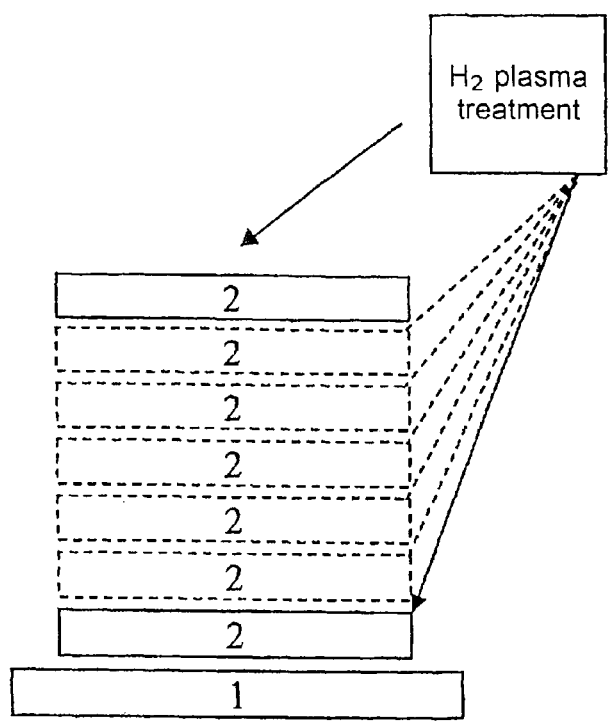
FIG. 1: shows a layer structure comprising individual film assemblies of Si:H on a substrate with plasma-enhanced treatment using a hydrogen plasma.
Figure 1A:
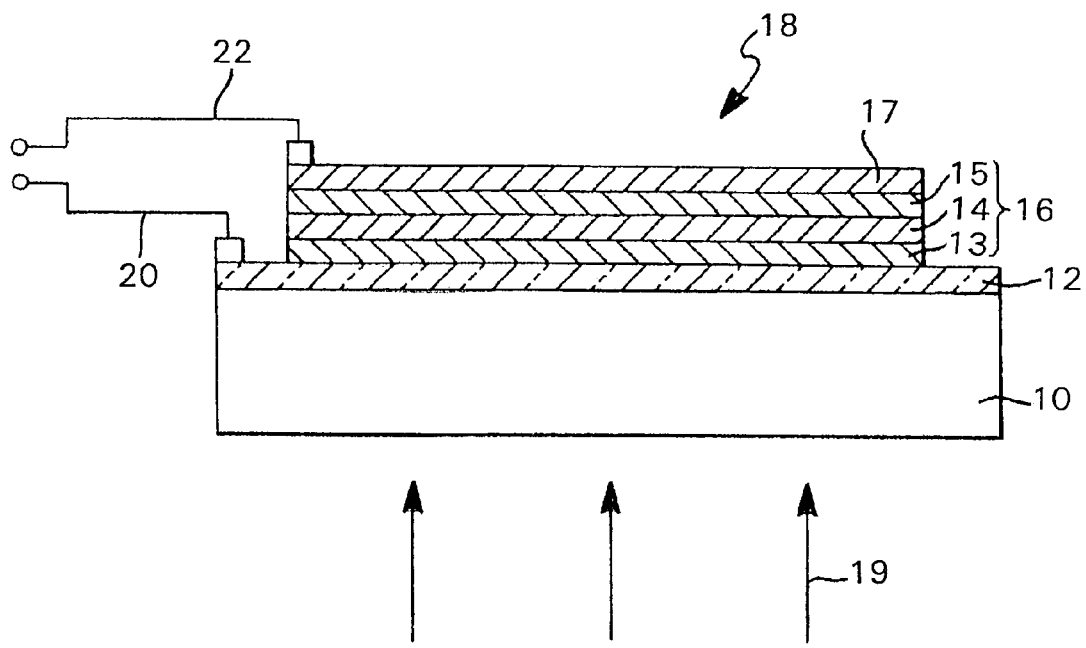
FIG. 1A: is a cross-sectional view of a silicon solar cell.

As shown in FIG. 1A, a prior art silicon solar cell is illustrated generally as 18 and comprises a transparent insulating substrate 10, a transparent electrically conductive layer 12 and a semiconductor photoelectric conversion laminate 16 composed of a p-type amorphous silicon layer 13, an i-type amorphous silicon layer 14, an n-type amorphous silicon layer 15, and an aluminum electrode 17 acting as the back contact. This configuration is practically used as a photoelectric conversion device capable of being produced at a relatively low cost. Such an amorphous solar cell 18 is designed so that light enters the solar cell through the transparent insulating substrate 10 and is absorbed mainly by the i-type amorphous silicon layer 14. An electromotive force is generated between the two electrodes, the transparent electrically conductive layer 12 and the aluminum electrode 17, and electricity is led out of the solar cell by a conductor 20.

FIG. 1A is a copy of FIG. 1 from U.S. Pat. No. 4,808,462, issued to Yaba, et al. on Feb. 28, 1989 and entitled, "Solar cell substrate" from which figure copy all of the reference numerals present in the original figure, as it appears in U.S. Pat. No. 4,808,462 have been removed. U.S. Pat. No. 4,808,462 is hereby incorporated by reference as if set forth in its entirety. The reference numerals that have been removed from the figure for this U.S. patent, essentially reproduced herein as FIG. 1A, indicate arrangements that are well known in the prior art.

Figure 1B:
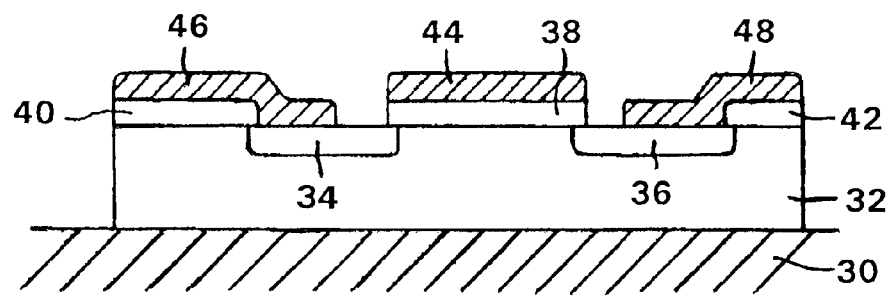
FIG. 1B: is a cross-sectional view of a thin-film transistor.

FIG. 1B shows an example of a typical basic structure of a possible thin film transistor. In the surface part of a semiconductor layer 32 provided on an insulating substrate 30, there are provided a source layer (source region) 34 and a drain layer (drain region) 36; and on a portion of the semiconductor layer 32 between the source layer 34 and the drain layer 36, on a portion of the semiconductor layer 32 at the left side of the source layer 34, and on a portion of the semiconductor layer 32 at the right side of the drain layer 36, there are provided insulating layers 38, 40, and 42, respectively. Also provided are a gate electrode 44 on the insulating layer 38, a source electrode 46 with an electric contact with the source layer 34 and a drain electrode 48 with an electric contact with the drain layer 36, respectively.

FIG. 1B is a copy of FIG. 1 from U.S. Pat. No. 4,814,842, issued to Nakagawa, et al. on Mar. 21, 1989 and entitled, "Thin film transistor utilizing hydrogenated polycrystalline silicon," from which figure copy all of the reference numerals present in the original figure, as it appears in U.S. Pat. No. 4,814,842 have been removed. U.S. Pat. No. 4,814,842 is hereby incorporated by reference as if set forth in its entirety. The reference numerals that have been removed from the figure for this U.S. patent, essentially reproduced herein as FIG. 1B, indicate arrangements that are well known in the prior art.

A device according to one aspect of the invention for the production of a μc-Si:H film on a substrate using a plasma CVD process was preconditioned in such a manner that an a-Si:H film was deposited in pulse-induced manner on the inner surfaces of the deposition chamber (reactor). The deposition chamber was covered with an a-Si:H film comprising several 10 s of nm, preferably several 100 s of nm.

Using a typical process pressure of 0.1–1 mbar, a-Si:H films (2) were alternately deposited from a precursor gas containing silicon and hydrogen, preferably a silane, in particular monosilane (SiH₄) with or without hydrogen dilution as a thin film with a thickness of from 0.1 to 5 nm on a substrate (1) (FIG. 1). The duration of the hydrogen plasma treatment may be at most 30 sec, preferably 10 sec, in particular 5 sec. For the deposition of the a-Si:H film and for the subsequent treatment of the film using the hydrogen plasma, a pulsed microwave (2.45 GHz) was used. This pulsed microwave technique makes it possible to exactly set the layer thickness on the basis of an accurately controlled pulse sequence (pulse duration ≧0.1 ms; pulse pause ≦200 ms) (the deposition takes place, as it were, in monolayers). The mean microwave power covers a range from approx. 150 mW/cm³ to approximately 1500 mW/cm³. The pulsed operation of the microwave leads on the one hand to a considerably lower thermal load on the substrate than with a constant mean power which is present with continuous microwave operation, and secondly leads to considerably more rapid deposition of the a-Si:H film assemblies with a high film quality. With the aid of extremely quick gas changes, it is possible to achieve very short individual process times, with the result that the effective rate, which is calculated from the quotient of the overall film thickness to the coating time for the overall a-Si:H film plus the time required for the hydrogen plasma treatment, at approx. 10–80 nm/min is at least one order of magnitude higher than has previously been indicated in the literature. The substrate temperature may lie between 25° C. and 400° C. Contrary to expectation, therefore, it is possible to produce a compact film of good quality even at T<100° C., in particular at T<50° C., making it possible to use the process according to one aspect of the invention to deposit μc-Si:H films (2) in particular even on temperature-sensitive plastic substrates (e.g. PE).

Figure 2:
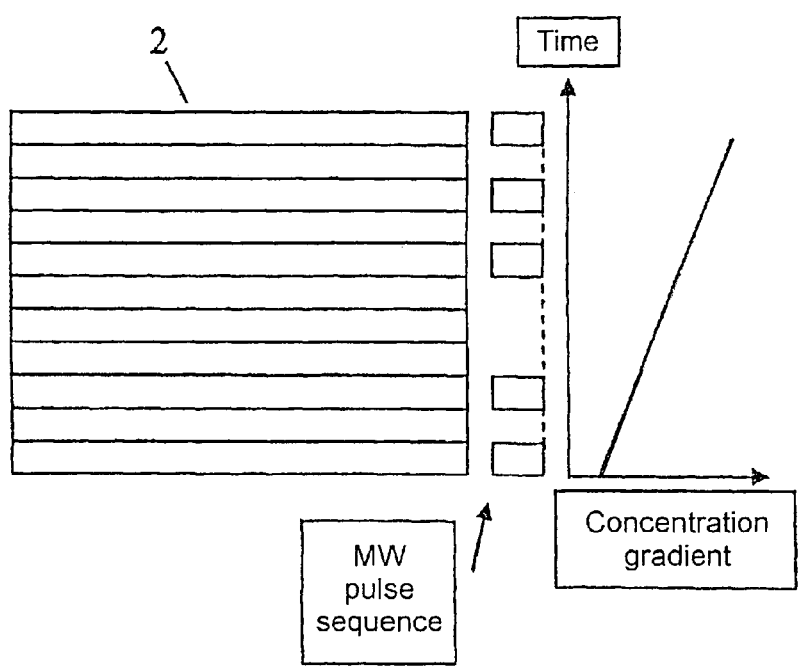
FIG. 2: shows a detailed illustration of the first film layer of Si:H applied to a substrate in the form of a degressive gradient.

FIG. 2 shows a detailed view of the first film layer (2) which has been applied to the substrate and has been deposited in the form of a degressive gradient with an elevated, inherent microcrystalline Si:H content.

In this case, the film-forming agent concentration increases with increasing time and number of pulses. The profile of the layer-forming agent concentration (concentration gradient) against the time and as a function of the number of pulses (microwave pulse sequence) is shown on the right in FIG. 2.

The hydrogen plasma in a preconditioned reactor produces two important effects: firstly, the μc-Si:H phase is preferentially formed, and furthermore the etching effect which runs in parallel leads to removal of undesired layers on the microwave window and the remaining inner reactor surfaces. Therefore, the hydrogen plasma has a beneficial effect on the desired material modification in combination with a cleaning action on the reactor. In this way, it is possible to introduce significantly extended maintenance intervals, which have a beneficial effect on industrial implementation.

Over the course of time, various proposed models for the formation of μc-Si:H have been developed. In the so-called etching model, the assumption is that atomic hydrogen formed by the plasma preferentially breaks open weak Si—Si bonds at the growing film surface and silicon atoms in the network are replaced, so that ultimately the crystalline phase (stronger bonds) dominates the amorphous phase. The so-called chemical annealing model takes account of the fact that, if the deposition parameters are selected appropriately, no change in film thickness is observed during the hydrogen plasma treatment phase. In the proposed model, atomic hydrogen penetrates into a growth zone below the film surface, and promotes the formation of a flexible network, i.e. a reorganization of the network in favor of the crystalline phase, without silicon bonds being etched away.

In the process according to one aspect of the invention, the formation process of the microcrystalline Si:H phase is very probably influenced by the fact that the hydrogen plasma which acts on the amorphous Si:H film which has previously been deposited effects virtually complete coverage of the previously deposited amorphous layer. The hydrogen coverage of the surface leads firstly, on account of the saturation of free valencies and secondly through the provision of recombination energy, to a drastic increase in the surface diffusion constant of the film-forming particles. This makes it possible for these particles to adopt positions which are favorable in terms of energy, leading to the formation of crystalline areas (seeds) and then to complete crystallization of a plurality of monolayers.

The films produced in this way are distinguished by a high crystallinity and good saturation of the grain boundaries between the individual crystallites. The transformation rate (a-Si:H to μc-Si:H) is considerably increased by the formation of seed films (mixed phase with elevated inherent μc-Si:H content) generated in the first atomic layers. According to one aspect of the invention, this is achieved by the targeted introduction of a rate gradient. Precise control of the abovementioned gradient can only be achieved by the pulsed mode of the microwave, since only in this way it is possible to separate fresh gas and off-gas influences on the film formation and to deliberately set gas mixtures or concentration ratios. Furthermore, the pulsed mode of the microwave makes it possible to use high peak powers and therefore to obtain high deposition rates. The phenomenon of the quality of film formation being reduced by the inclusion of particles is not observed. Clearly, electrostatic influences from the plasma boundary layer play a significant role; the pulsed mode suppresses the formation of particles even at high peak powers. Consequently, these films can be used economically in electronic components, in particular in solar cells, for the first time.

Figure 3:
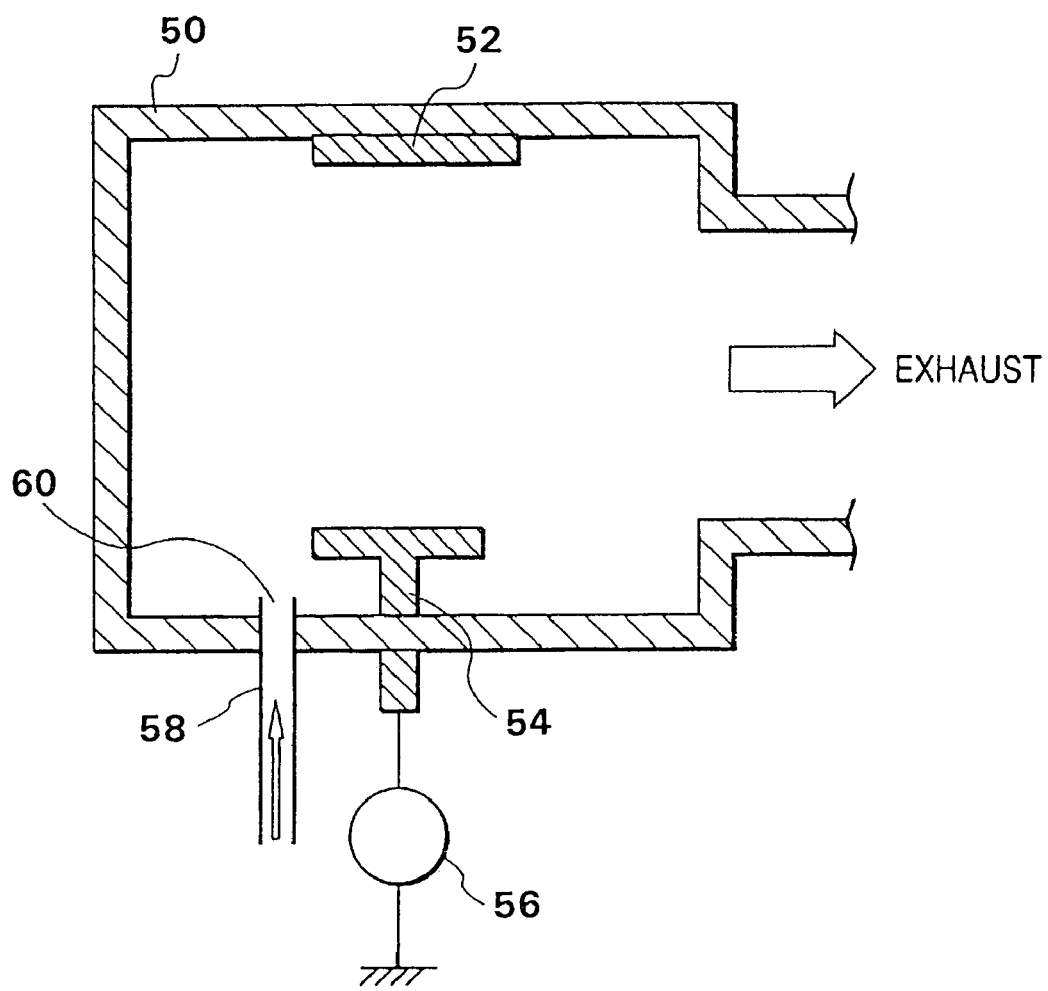
FIG. 3: is a schematic illustration of a CVD deposition apparatus.

FIG. 3 shows a schematic view of an apparatus in accordance with one aspect of the invention. Thus, a substrate 52 is held on the top part of a film forming chamber 50, or is supported in the chamber 50, and the substrate is possibly heated to be kept at a desired temperature. A film-forming gas is supplied through a source gas inlet pipe 58 to be introduced from the bottom part into the inside of the film forming chamber 50. The film-forming gas is exhausted to the right in the drawing by an exhaust pump (not shown). High-frequency power is supplied from a high-frequency power supply 56 to be introduced through a high-frequency electrode 54 into the inside of the film forming chamber 50 to decompose and excite the source gas, thereby generating a plasma.

FIG. 3 is a copy of FIG. 1 from U.S. Pat. No. 6,057,005, issued to Nishimoto on May 2, 2000 and entitled, "Method of forming semiconductor thin film," from which figure copy all of the reference numerals present in the original figure, as it appears in U.S. Pat. No. 6,057,005 have been removed. U.S. Pat. No. 6,057,005 is hereby incorporated by reference as if set forth in its entirety. The reference numerals that have been removed from the figure for this U.S. patent, essentially reproduced herein as FIG. 3 indicate arrangements that are well known in the prior art.

One feature of the invention resides broadly in a plasma CVD process for the production of a microcrystalline Si:H film on a substrate, comprising the following steps: plasma-enhanced CVD coating of the substrate with at least one thin amorphous Si:H film, plasma-enhanced treatment of the amorphous Si:H film using a hydrogen plasma, the amorphous Si:H film being transformed into a microcrystalline Si:H film, and repeating the steps if necessary characterized in that the coating or the treatment is carried out with a continuous flow of the coating gases or the treatment gases and using pulsed electromagnetic radiation which excites the plasma.

Another feature of the invention resides broadly in the process, characterized in that an amorphous Si:H film in each case comprising 1 to 50 amorphous Si:H monolayers is deposited.

Yet another feature of the invention resides broadly in the process, characterized in that the first film layers which are applied to the substrate are deposited in the form of a degressive gradient with an elevated, inherent microcrystalline Si:H fraction.

Still another feature of the invention resides broadly in the process, characterized in that a thin amorphous Si:H film which is in each case 0.1 to 5 nm thick is deposited and transformed.

A further feature of the invention resides broadly in the process, characterized in that a treatment duration with the pulsed hydrogen plasma of up to 30 seconds, in particular of up to 10 seconds, is set.

Another feature of the invention resides broadly in the process, characterized in that a duration of a pulse of the electromagnetic radiation of $\geq 0.1$ ms is set.

Yet another feature of the invention resides broadly in the process, characterized in that a pause between two pulses of the electromagnetic radiation of ≦200 ms is set.

Still another feature of the invention resides broadly in the process, characterized in that overall a microcrystalline Si:H film which is up to 5000 nm thick is produced on the substrate.

A further feature of the invention resides broadly in the process, characterized in that the plasma is excited by means of microwave radiation.

Another feature of the invention resides broadly in the process, characterized in that an excitation frequency of the magnetic radiation of 2.45 GHz is used.

Yet another feature of the invention resides broadly in the process, characterized in that a mean microwave power of 150 mW/cm$^3$ to 1500 mW/cm$^3$ is used.

Still another feature of the invention resides broadly in the process, characterized in that the amorphous Si:H film is deposited from a coating gas which contains at least one Si-organic film-forming agent.

A further feature of the invention resides broadly in the process, characterized in that the coating gas used is a silane, in particular SiH$_4$ or a chlorosilane.

Another feature of the invention resides broadly in the process, characterized in that hydrogen is added to the coating gas.

Yet another feature of the invention resides broadly in the process, characterized in that a process pressure of from 0.1 to 1 mbar is set.

Still another feature of the invention resides broadly in the process, characterized in that the coating gas is changed very quickly after each Si:H film.

A further feature of the invention resides broadly in the process, characterized in that the substrate temperature during the process does not exceed 200° C., preferably 100° C., in particular 50° C.

Another feature of the invention resides broadly in the process, characterized in that conductivities of the microcrystalline Si:H film of from $10^{-7}$ S/cm to 10 S/cm are set.

Yet another feature of the invention resides broadly in the process, characterized in that a substrate made from a glass, a glass ceramic or a plastic is used.

Still another feature of the invention resides broadly in the process, characterized in that the substrate is provided with a transparent, conductive film.

A further feature of the invention resides broadly in the process, characterized in that the transparent, conductive film is an ITO film, a doped SnO$_2$ film or a doped ZnO film.

Another feature of the invention resides broadly in a device for producing a microcrystalline Si:H film, on a substrate using the plasma CVD process as claimed in at least one of claims 1 to 21, characterized in that, before production of the microcrystalline Si:H film commences, an amorphous Si:H film is deposited on the inner surfaces of the device, in particular on the inner surfaces of the deposition chamber.

Yet another feature of the invention resides broadly in the use of a microcrystalline Si:H film on a substrate which has been produced as described as a component of thin-film solar cell.

Still another feature of the invention resides broadly in the use of a microcrystalline Si:H film on a substrate which has been produced as described as a component of a thin-film transistor (TFT).

One feature of the invention resides broadly in a plasma CVD process for the production of a microcrystalline Si:H film on a substrate, comprising the following steps: plasma-enhanced CVD coating of the substrate with at least one thin amorphous Si:H film, plasma-enhanced treatment of the amorphous Si:H film using a hydrogen plasma, the amorphous Si:H film being transformed into a microcrystalline Si:H film, and repeating the steps if necessary characterized in that the coating or the treatment is carried out with a continuous flow of the coating gases or the treatment gases and using pulsed electromagnetic radiation to excite the corresponding plasma.

One feature of the invention resides broadly in a plasma chemical vapor deposition process for the production of a microcrystalline hydrogenated silicon film or body on a substrate, comprising the following steps: plasma-enhanced chemical vapor deposition coating of the substrate with at least one thin amorphous hydrogenated silicon film, plasma-enhanced treatment of the amorphous hydrogenated silicon film or body using a hydrogen plasma, the amorphous hydrogenated silicon film or body being transformed into a microcrystalline hydrogenated silicon film, and repeating the steps if necessary characterized in that the coating or the treatment is carried out with a continuous flow of the coating gases or the treatment gases and using pulsed electromagnetic radiation which excites the plasma.

With the aid of the method of U.S. Pat. No. 5,643,638, layers having a composition gradient and/or structure gradient can be produced. Via these gradients, specific physical and/or chemical characteristics can be varied in a targeted manner. These physical and/or chemical characteristics include, for example: refractive index, hardness, internal stress, hydrophily or general wetting ability, module of elasticity and the like. Gradient layers having constant composition but changeable physical/chemical characteristics can be produced. An example of this is the production of a TiO$_2$ layer from TiCl$_4$+O$_2$. For the production of a TiO$_2$ layer having characteristics which come close to solid material, a specific pulse amplitude and pulse duration are necessary. By shortening the pulse duration, the TiO$_2$ layer becomes increasingly porous in the direction of growth and the refractive index (and hardness) is lower even though the layer composition is constant over the layer thickness. Thus, said layer gradient is possibly in the layer composition. In one embodiment said gradient in said layer is defined by a transition from organic to inorganic. In one embodiment said gradient is a gradient in the structure of said layer. In one embodiment said layer gradient is varied so as to provide a gradient of at least one of the following characteristics: hardness, wettability, refractive index, absorption, porosity, crystal structure, modulus of elasticity and electrical conductivity.

In one embodiment of the invention use may possibly be made of 3-chloropropyltrimethoxysilane (United Chemical Technologies Inc. C-3300) as the chlorosilane.

In one possible embodiment the chlorosilane may possibly comprises silicon chloride hydride (Cl$_2$H$_2$Si).

The entry in the Merck Index relating to silane, on page 8567, is hereby incorporated by reference as if set forth in its entirety herein (MERCK INDEX, Thirteenth Edition, copyright 2001 by Merck & Co., Inc, IBN Number 0911910-13-1).

In one embodiment of the invention the conductive film may be a tin oxide (SnO) film.

The components disclosed in the various publications, disclosed or incorporated by reference herein, may be used in the embodiments of the present invention, as well as equivalents thereof.

The appended drawings in their entirety, including all dimensions, proportions and/or shapes in at least one embodiment of the invention, are accurate and are hereby included by reference into this specification.

All, or substantially all, of the components and methods of the various embodiments may be used with at least one embodiment or all of the embodiments, if more than one embodiment is described herein.

All of the patents, patent applications and publications recited herein, and in the Declaration attached hereto, are hereby incorporated by reference as if set forth in their entirety herein.

The following patents, patent applications, or patent publications, or other documents which were cited in the German Patent Office, namely: Federal Republic of Germany Patent No. 44 45 427 (corresponding to U.S. Pat. No. 5,643,638); U.S. Pat. No. 5,693,957, U.S. Pat. No. 5,618,758, U.S. Pat. No. 5,344,796, U.S. Pat. No. 5,334,423, U.S. Pat. No. 5,204,272, U.S. Pat. No. 4,891,330, and U.S. Pat. No. 4,762,803; European Patent No. 05 71 632 (corresponding to U.S. Pat. No. 5,387,542); International Patent Publications: No. WO 97 24 769 (corresponding to U.S. Pat. No. 6,309,906), No. WO 93 13 553 (corresponding to U.S. Pat. No. 5,231,048), and No. WO 93 10 555 (corresponding to U.S. Pat. No. 5,387,542); and documents: APPL. PHYS. LETTERS, Volume 56, 1990, pages 533 to 535, APPL. PHYS. LETTERS, Volume 60, 1992, pages 2874 to 2876, J. APPL. PHYS., Volume 31, 1992, pages 1948 to 1952, SOLAR ENERGY MATERIALS AND SOLAR CELLS, Volume 34, 1994, pages 509 to 515, MATERIAL RESEARCH SOCIETY SYMPOSIUM PROCEEDINGS, Volume 452, 1997, pages 737 ff., and J. OF THE CERAMIC SOCIETY OF JAPAN, Volume 99, 1991, pages 894–902, are hereby incorporate as if set forth in their entirety herein.

The following patents, patent applications, or patent publications, which were cited in the PCT Search Report dated Dec. 20, 2000 (date of mailing), namely: EP 0 919 643 (corresponding to U.S. Pat. No. 6,100,466); FR 2,743,193 (corresponding to U.S. Pat. No. 6,309,906); EP 0 526 779 (corresponding to U.S. Pat. No. 5,242,530); and U.S. Pat. No. 4,804,605, are hereby incorporated by reference as if set forth in their entirety herein.

The following patents, referred to above, namely, U.S. Pat. No. 5,204,272 issued to Guha, et al. on Apr. 20, 1993 and entitled, "Semiconductor device and microwave process for its manufacture"; U.S. Pat. No. 5,231,048 issued to Guha, et al. on Jul. 27, 1993 and entitled, "Microwave energized deposition process wherein the deposition is carried out at a pressure less than the pressure of the minimum point of the deposition system's Paschen curve"; U.S. Pat. No. 5,334,423 issued to Guha, et al. on Aug. 2, 1994 and entitled, "Microwave energized process for the preparation of high quality semiconductor material"; U.S. Pat. No. 5,344,796 issued to Shin, et al. on Sep. 6, 1994 and entitled, "Method of making polycrystalline silicon thin film"; U.S. Pat. No. 5,387,542 issued to Yamamoto, et al. on Feb. 7, 1995 and entitled, "Polycrystalline silicon thin film and low temperature fabrication method thereof"; U.S. Pat. No. 5,470,619 issued to Ahn, et al. on Nov. 28, 1995 and entitled, "Method of the production of polycrystalline silicon thin films"; U.S. Pat. No. 5,486,237 issued to Sano, et al. on Jan. 23, 1996 and entitled, "Polysilicon thin film and method of preparing polysilicon thin film and photovoltaic element containing same"; U.S. Pat. No. 5,618,758 issued to Tomita, et al. on Apr. 8, 1997 and entitled, "Method for forming a thin semiconductor film and a plasma CVD apparatus to be used in the method"; U.S. Pat. No. 5,643,638 issued to Otto, et al. on Jul. 1, 1997 and entitled, "Plasma CVD method of producing a gradient layer"; U.S. Pat. No. 5,693,957 issued to Sano, et al. on Dec. 2, 1997 and entitled, "Photovoltaic element and method of manufacturing the same"; and U.S. Pat. No. 6,309,906 issued to Meier, et al. on Oct. 30, 2001 and entitled, "Photovoltaic cell and method of producing that cell"; are hereby incorporated by reference as if set forth in their entirety herein.

The following documents are to be incorporated, namely: Asano, A.; APPL. PHYS. LETT. 56 (1990) 533; Jin Jang; Sung Ok Koh; Tae Gon Kim; Sung Chul Kim, APPL. PHYS. LETT. 60 (1992) 2874; Otobe, M.; Oda, S.; JPN. J. APPL. PHYS. 31 (1992) 1948; Kyu Chang Park, Sung Yi Kim; Min Park; Jung Mok Jun; Kyung Ha Lee; Jin Jang; SOLAR ENERGY MATERIALS AND SOLAR CELLS, Vol. 34 (1994), 509; Hapke, P.; Carius, R.; Finger, F.; Lambertz, A.; Vetterl, 0.; Wagner H. MATERIAL RESEARCH SOCIETY SYMPOSIUM PROCEEDINGS, Vol. 452; (1997), 737.

The corresponding foreign and international patent publication applications, namely, Federal Republic of Germany Patent Application No. 1999 35 046.9-33 filed on Jul. 26, 1999, having the title, "PLASMA-CVD-VERFAHREN UND VORRICHTUNG ZUR HERSTELLUNG EINER MIKROKRISTALLINEN Si:H-SCHICHT AUF EINEM SUBSTRAT", having the inventors Manfred LOHMEYER, Stefan BAUER, Burkhard DANIELZIK, Wolfgang MÖHL, and Nina FREITAG; DE-OS 199 35 046, published on Mar. 1, 2001; and Federal Republic of Germany Patent No. 199 35 046 C2, issued on Jul. 12, 2001; and International Application No. PCT/EP/00/07082, filed on Jul. 25, 2000, having inventors Manfred LOHMEYER, Stefan BAUER, Burkhard DANIELZIK, Wolfgang MÖHL, and Nina FREITAG, as well as their published equivalents, and other equivalents or corresponding applications, if any, in corresponding cases in the Federal Republic of Germany and elsewhere, and the references and documents cited in any of the documents cited herein, such as the patents, patent applications and publications, are hereby incorporated by reference as if set forth in their entirety herein.

The following applications, assigned to the Assignee hereof, and relating to substrate glass material compositions which may possibly be used or adapted for use in at least one possible embodiment of the invention, are to be incorporated by reference as if set forth in their entirety herein: U.S. patent application Ser. No. 09/758,919 filed on Jan. 11, 2001, having inventors Dr. Ulrich PEUCHERT and Dr. Peter BRIX, having Attorney Docket No. NHL-SCT-18 US, and having the title, "Alkali-free aluminoborosilicate glass, and uses thereof"; U.S. patent application Ser. No. 09/758,952 filed on Jan. 11, 2001, having inventors Dr. Ulrich PEUCHERT and Dr. Peter BRIX, and having the title, "Alkali-free aluminoborosilicate glass, and uses thereof"; U.S. patent application Ser. No. 09/758,946 filed on Jan. 11, 2001, having inventors Dr. Ulrich PEUCHERT and Dr. Peter BRIX, and having the title, "Alkali-free aluminoborosilicate glass, and uses thereof"; U.S. patent application Ser. No. 09/758,903 filed on Jan. 11, 2001, having inventors Dr. Ulrich PEUCHERT and Dr. Peter BRIX, having Attorney Docket No. NHL-SCT-21 US, and having the title, "Alkali-free aluminoborosilicate glass, and uses thereof". The foregoing applications are hereby incorporated by reference as if set forth in their entirety herein.

Some examples of thin-film solar cells, features of which may possibly be used or adapted for use in at least one possible embodiment of the invention may be found in the following U.S. Pat. No. 4,064,521, issued to inventor Carlson on Dec. 20, 1977 and entitled, "Semiconductor device having a body of amorphous silicon"; U.S. Pat. No. 4,338,482, issued to inventor Gordon on Jul. 6, 1982 and entitled, "Photovoltaic cell"; U.S. Pat. No. 4,433,202, issued to inventors Maruyama, et al. on Feb. 21, 1984 and entitled, "Thin film solar cell"; U.S. Pat. No. 4,500,743, issued to inventors Hayashi et al. on Feb. 19, 1985 and entitled, "Amorphous semiconductor solar cell having a grained transparent electrode"; U.S. Pat. No. 4,609,770, issued to inventors Nishiura et al. on Sep. 2, 1986 and entitled, "Thin-film solar cell array; U.S. Pat. No. 4,749,588, issued to inventors Fukuda et al. on Jun. 7, 1988 and entitled, "Process for producing hydrogenated amorphous silicon thin film and a solar cell"; U.S. Pat. No. 4,891,330, issued to inventors Guba et al. on Jan. 2, 1990 and entitled, "Method of fabricating N-type and P-type microcrystalline semiconductor alloy material including band gap widening elements"; U.S. Pat. No. 4,948,740, issued to inventor Plaettner on Aug. 14, 1990 and entitled, "Method for the integrated series-interconnection of thick-film solar cells and method for the manufacture of tandem solar cells"; U.S. Pat. No. 5,055,141, issued to inventors Arya et al. on Oct. 8, 1991 and entitled, "Enhancement of short-circuit current by use of wide bandgap N-layers in P-I-N amorphous silicon photovoltaic cells"; U.S. Pat. No. 5,482,570, issued to inventors Saurer et al. on Jan. 9, 1996 and entitled, "Photovoltaic cell"; U.S. Pat. No. 5,828,117, issued to inventors Kondo et al. on Oct. 27, 1998 and entitled, "Thin-film solar cell"; U.S. Pat. No. 5,853,498, issued to inventors Beneking et al. on Dec. 29, 1998 and entitled, "Thin film solar cell"; and U.S. Pat. No. 6,124,545, issued to inventors Bauer et al. on Sep. 26, 2000 and entitled, "Thin film solar cell". The foregoing patents are hereby incorporated by reference as if set forth in their entirety herein Some examples of microcrystalline hydrogenated silicon in thin-film solar cells, features of which may possibly be used or adapted for use in at least one possible embodiment of the invention may be found in the following U.S. Pat. No. 4,907,052, issued to inventors Takada et al. on Mar. 6, 1990 and entitled, "Semiconductor tandem solar cells with metal silicide barrier"; U.S. Pat. No. 4,995,341, issued to inventor Matsuyama on Feb. 26, 1991 and entitled, "Microwave plasma CVD apparatus for the formation of a large-area functional deposited film"; U.S. Pat. No. 5,055,141, issued to inventors Arya et al. on Oct. 8, 1991 and entitled, "Enhancement of short-circuit current by use of wide bandgap N-layers in P-I-N amorphous silicon photovoltaic cells"; U.S. Pat. No. 5,696,349, issued to inventor Nakata on Nov. 11, 1997 and entitled, "Fabrication of a thin film transistor and production of a liquid crystal display apparatus"; and U.S. Pat. No. 6,072,117, issued to inventors Matsuyama et al. on Jun. 6, 2000 and entitled, "Photovoltaic device provided with an opaque substrate having a specific irregular surface structure". The foregoing patents are hereby incorporated by reference as if set forth in their entirety herein.

Some examples of substrate materials for use in thin-film solar cells, features of which may possibly be used or adapted for use in at least one possible embodiment of the invention may be found in the following U.S. Pat. No. 4,873,118, issued to inventors Elias et al. on Oct. 10, 1989 and entitled, "Oxygen glow treating of ZnO electrode for thin film silicon solar cell"; U.S. Pat. No. 5,264,376, issued to inventors Abbott et al. on Nov. 23, 1993 and entitled, "Method of making a thin film solar cell"; U.S. Pat. No. 5,415,700, issued to inventors Arthur et al. on May 16, 1995 and entitled, "Concrete solar cell"; U.S. Pat. No. 5,800,631, issued to inventors Yamada et al. on Sep. 1, 1998 and entitled, "Solar cell module having a specific back side covering material and a process for the production of said solar cell module"; U.S. Pat. No. 5,964,962, issued to inventors Sannomiya et al. on Oct. 12, 1999 and entitled, "Substrate for solar cell and method for producing the same; substrate treatment apparatus; and thin film solar cell and method for producing the same"; and U.S. Pat. No. 6,331,673, issued to inventors Kataoka et al. on Dec. 18, 2001 and entitled, "Solar cell module having a surface side covering material with specific nonwoven glass fiber member". The foregoing patents are hereby incorporated by reference as if set forth in their entirety herein.

Some examples of thin-film transistors, features of which may possibly be used or adapted for use in at least one possible embodiment of the invention may be found in the following U.S. Pat. No. 6,258,638, issued to inventors Tanabe et al. on Jul. 10, 2001 and entitled, "Method of manufacturing thin film transistor"; U.S. Pat. No. 6,277,679, issued to inventor Ohtani on Aug. 21, 2001 and entitled, "Method of manufacturing thin film transistor"; U.S. Pat. No. 6,281,055, issued to inventor Yang on Aug. 28, 2001 and entitled, "Method of fabricating a thin film transistor"; U.S. Pat. No. 6,288,413, issued to inventors Kamiura et al. on Sep. 11, 2001 and entitled, "Thin film transistor and method for producing same"; U.S. Pat. No. 6,300,175, issued to inventor Moon on Oct. 9, 2001 and entitled, "Method for fabricating thin film transistor"; U.S. Pat. No. 6,300,659, issued to inventors Zhang et al. on Oct. 9, 2001 and entitled, "Thin-film transistor and fabrication method for same"; U.S. Pat. No. 6,312,992, issued to inventor Cho on Nov. 6, 2001 and entitled, "Thin film transistor and method for fabricating the same"; U.S. Pat. No. 6,316,294, issued to inventors Yoon et al. on Nov. 13, 2001 and entitled, "Thin film transistor and a fabricating method thereof"; and U.S. Pat. No. 6,316,295, issued to inventors Jang et al. on Nov. 13, 2001 and entitled, "Thin film transistor and its fabrication". The foregoing patents are hereby incorporated by reference as if set forth in their entirety herein.

Some examples of hydrogenated silicon in thin-film transistors, features of which may possibly be used or adapted for use in at least one possible embodiment of the invention may be found in the following U.S. Pat. No. 5,093,703, issued to inventors Minami et al. on Mar. 3, 1992 and entitled, "Thin film transistor with 10–15% hydrogen content"; U.S. Pat. No. 5,153,690, issued to inventors Tsukada et al. on Oct. 6, 1992 and entitled, "Thin-film device"; U.S. Pat. No. 5,266,825, issued to inventors Tsukuda et al. on Nov. 30, 1993 and entitled, "Thin-film device"; U.S. Pat. No. 5,326,712, issued to inventor Bae on Jul. 5, 1994 and entitled, "Method for Manufacturing a thin film transistor"; U.S. Pat. No. 5,397,718, issued to inventors Furuta et al. on Mar. 14, 1995 and entitled, "Method of manufacturing thin film transistor"; U.S. Pat. No. 5,627,089, issued to inventors Kim et al. on May 6, 1997 and entitled, "Method for fabricating a thin film transistor using APCVD"; U.S. Pat. No. 5,648,276, issued to inventors Hara et al. on Jul. 15, 1997 and entitled, "Method and apparatus for fabricating a thin film semiconductor device"; U.S. Pat. No. 5,696,387, issued to inventors Choi et al. on Dec. 9, 1997 and entitled, "Thin film transistor in a liquid crystal display having a microcrystalline and amorphous active layers with an intrinsic semiconductor layer attached to same"; U.S. Pat. No. 5,824,572, issued to inventors Fukui et al. on Oct. 20, 1998 and entitled, "method of manufacturing thin film transistor"; U.S. Pat. No. 5,834,071, issued to inventor Lin on Nov. 10, 1998 and entitled, "Method for forming a thin film transistor"; U.S. Pat. No. 6,107,641, issued to inventors Mei et al. on Aug. 22, 2000 and entitled, "Thin film transistor with reduced parasitic capacitance and reduced feed-through voltage"; U.S. Pat. No. 6,207,472, issued to inventors Callegari et al. on Mar. 27, 2001 and entitled, "Low temperature thin film transistor fabrication"; U.S. Pat. No. 6,235,559, issued to inventor Kuo on May 22, 2001 and entitled, "Thin film transistor with carbonaceous gate dielectric"; and U.S. Pat. No. 6,258,638, issued to inventors Tanabe et al. on Jul. 10, 2001 and entitled, "Method of manufacturing thin film transistor". The foregoing patents are hereby incorporated by reference as if set forth in their entirety herein.

Some examples of substrate materials for thin-film transistors, features of which may possibly be used or adapted for use in at least one possible embodiment of the invention may be found in the following U.S. Pat. No. 4,335,161, issued to inventor Lao on Jun. 15, 1981 and entitled, "Thin film transistors, thin film transistor arrays, and a process for preparing the same"; U.S. Pat. No. 4,404,731, issued to inventor Poleshuk on Sep. 20, 1983 and entitled, "Method of forming a thin film transistor"; U.S. Pat. No. 5,306,651, issued to inventors Masumo et al. on Apr. 26, 1994 and entitled, "Process for preparing a polycrystalline semiconductor thin film transistor"; U.S. Pat. No. 5,330,941, issued to inventors Yaba et al. on Jul. 19, 1994 and entitled, "Quartz glass substrate for polysilicon thin film transistor liquid crystal display"; U.S. Pat. No. 5,665,611, issued to inventors Sandhu et al. on Sep. 9, 1997 and entitled, "Method of forming a thin film transistor using fluorine passivation"; U.S. Pat. No. 5,811,323, issued to inventors Miyasaka et al. on Sep. 22, 1998 and entitled, "Process for fabricating a thin film transistor"; U.S. Pat. No. 5,834,345, issued to inventor Shimizu on Nov. 10, 1998 and entitled, "Method of fabricating field effect think film transistor"; U.S. Pat. No. 5,936,259, issued to inventors Katz et al. on Aug. 10, 1999 and entitled, "Thin film transistor and organic semiconductor material thereof"; U.S. Pat. No. 6,207,472, issued to inventors Callegari et al. on Mar. 27, 2001 and entitled, "Low temperature thin film transistor fabrication"; and U.S. Pat. No. 6,329,226, issued to inventors Jones et al. on Dec. 11, 2001 and entitled, "Method for fabricating a thin-film transistor". The foregoing patents are hereby incorporated by reference as if set forth in their entirety herein.

Some examples of microwave plasma chemical vapor deposition apparatus, features of which may possibly be used or adapted for use in at least one possible embodiment of the invention may be found in the following U.S. Pat. No. 4,265,730, issued to inventors Hirose et al. on May 5, 1981 and entitled, "Surface treating apparatus utilizing plasma generated by microwave discharge"; U.S. Pat. No. 4,715,927, issued to inventors Johncock et al. on Dec. 29, 1987 and entitled, "Improved method of making a photoconductive member"; U.S. Pat. No. 4,785,763, issued to inventor Saitoh on Nov. 22, 1988 and entitled, "Apparatus for the formation of a functional deposited film using microwave plasma chemical vapor deposition process"; U.S. Pat. No. 4,836,140, issued to inventor Koji on Jun. 6, 1989 and entitled, "Photo-CVD apparatus"; U.S. Pat. No. 4,866,346, issued to inventors Gaudreau on Sep. 12, 1989 and entitled, "Microwave plasma generator"; U.S. Pat. No. 4,995,341, issued to inventor Matsuyama on Feb. 26, 1991 and entitled, "Microwave plasma CVD apparatus for the formation of a large-area functional deposited film"; U.S. Pat. No. 5,232,507, issued to inventors Ohtoshi et al. on Aug. 3, 1993 and entitled, "Apparatus for forming deposited films with microwave plasma CVD method"; U.S. Pat. No. 5,443,645, issued to inventors Otoshi et al. on Aug. 22, 1995 and entitled, "Microwave plasma CVD apparatus comprising coaxially aligned multiple gas pipe gas feed structure"; U.S. Pat. No. 5,510,151, issued to inventors Matsuyama et al. on Apr. 23, 1996 and entitled, "Continuous film-forming process using microwave energy in a moving substrate web functioning as a substrate and plasma generating space"; U.S. Pat. No. 5,919,310, issued to inventors Fujioka et al. on Jul. 6, 1999 and entitled, "Continuously film-forming apparatus provided with improved gas gate means"; U.S. Pat. No. 6,028,393, issued to inventors Izu et al. on Feb. 22, 2000 and entitled, "E-beam/microwave gas jet PECVD method and apparatus for depositing and/or surface modification of thin film materials"; and U.S. Pat. No. 6,253,703, issued to inventors Echizen et al. on Jul. 3, 2001 and entitled, "Microwave chemical vapor deposition apparatus". The foregoing patents are hereby incorporated by reference as if set forth in their entirety herein.

Some examples of making tin oxide films and doped tin oxide films, features of which may possibly be used or adapted for use in at least one possible embodiment of the invention may be found in the following U.S. Pat. No. 5,330,855, issued to inventors Semancik et al. on Jul. 19, 1994 and entitled, "Planar epitaxial films of $SnO_2$"; U.S. Pat. No. 5,397,920, issued to inventor Tran on Mar. 14, 1995 and entitled, "Light transmissive, electrically-conductive, oxide film and methods of production"; U.S. Pat. No. 5,527,391, issued to inventors Echizen et al. on Jun. 18, 1996 and entitled, "Method and apparatus for continuously forming functional deposited films with a large area by a microwave plasma CVD method"; U.S. Pat. No. 5,830,530, issued to inventor Jones on Nov. 3, 1998 and entitled, "Chemical vapor deposition of tin oxide films"; U.S. Pat. No. 5,864,149, issued to inventor Yamamori on Jan. 26, 1999 and entitled, "Staggered thin film transistor with transparent electrodes and an improved ohmic contact structure"; U.S. Pat. No. 6,057,005, issued to inventor Nishimoto on May 2, 2000 and entitled, "Method of forming semiconductor thin film"; U.S. Pat. No. 6,165,598, issued to inventor Nelson on Dec. 26, 2000 and entitled, "Color suppressed anti-reflective glass"; U.S. Pat. No. 6,271,053, issued to inventor Kondo on Aug. 7, 2001 and entitled, "Method of manufacturing a thin film solar battery module"; U.S. Pat. No. 6,281,429, issued to inventors Takada et al. on Aug. 28, 2001 and entitled, "Photoelectric conversion element"; U.S. Pat. No. 6,294,722, issued to inventors Kondo et al. on Sep. 25, 2001 and entitled, "Integrated thin-film solar battery"; U.S. Pat. No. 6,300,556, issued to inventors Yamagishi et al. on Oct. 9, 2001 and entitled, "Solar cell module". The foregoing patents are hereby incorporated by reference as if set forth in their entirety herein.

Some examples of making zinc oxide films and doped zinc oxide films, features of which may possibly be used or adapted for use in at least one possible embodiment of the invention may be found in the following U.S. Pat. No. 5,470,618, issued to inventors Ohara et al. on Nov. 28, 1995 and entitled, "Method of making zinc-based transparent conductive film"; U.S. Pat. No. 5,578,501, issued to inventor Niwa on Nov. 26, 1996 and entitled, "Method of manufacturing a solar cell by formation of a zinc oxide transparent conductive layer"; U.S. Pat. No. 5,804,466, issued to inventors Arao et al. on Sep. 8, 1998 and entitled, "Process for production of zinc oxide thin film, and process for production of semiconductor device substrate and process for production of photoelectric conversion device using the same film"; U.S. Pat. No. 6,140,570, issued to inventor Kariya on Oct. 31, 2000 and entitled, "Photovoltaic element having a back side transparent and electrically conductive layer with a light incident side surface region having a specific cross section and a module comprising said photovoltaic element"; U.S. Pat. No. 6,224,736, issued to inventor Miyamoto on May 1, 2001 and entitled, "Apparatus and method for forming thin film of zinc oxide"; U.S. Pat. No. 6,242,080, issued to inventor Kondo on Jun. 5, 2001 and entitled, "Zinc oxide thin film and process for producing the film"; U.S. Pat. No. 6,071,561, issued to inventors Gordon et al. on Jun. 6, 2000 and entitled, "Chemical vapor deposition of fluorine-doped zinc oxide"; and U.S. Pat. No. 5,470,618, issued to inventors Ohara et al. on Nov. 28, 1995 and entitled, "Method of making zinc-based transparent conductive film". The foregoing patents are hereby incorporated by reference as if set forth in their entirety herein.

Some examples of making indium-tin-oxide (ITO) films, features of which may possibly be used or adapted for use in at least one possible embodiment of the invention may be found in the following U.S. Pat. No. 5,514,217, issued to inventors Niino et al. on May 7, 1996 and entitled, "Microwave plasma CVD apparatus with a deposition chamber having a circumferential wall comprising a curved moving substrate web and a microwave application means having a specific dielectric member on the exterior thereof"; U.S. Pat. No. 5,527,396, issued to inventors Saitoh et al. on Jun. 18, 1996 and entitled, "Deposited film forming apparatus"; U.S. Pat. No. 5,559,344, issued to inventor Kawachi on Sep. 24, 1996 and entitled, "Thin-film semiconductor element, thin-film semiconductor device and methods of fabricating the same"; U.S. Pat. No. 5,603,778, issued to inventor Sonoda on Feb. 18, 1997 and entitled, "Method of forming transparent conductive layer, photoelectric conversion device using the transparent conductive layer, and manufacturing method for the photoelectric conversion device"; U.S. Pat. No. 5,804,466, issued to inventors Arao et al. on Sep. 8, 1998 and entitled, "Process for production of zinc oxide thin film, and process for production of semiconductor device substrate and process for production of photoelectric conversion device using the same film"; U.S. Pat. No. 5,913,986, issued to inventor Matsuyama on Jun. 22, 1999 and entitled, "Photovoltaic element having a specific doped layer"; and U.S. Pat. No. 6,146,929, issued to inventors Oana et al. on Nov. 14, 2000 and entitled, "Method for manufacturing semiconductor device using multiple steps continuously without exposing substrate to the atmosphere". The foregoing patents are hereby incorporated by reference as if set forth in their entirety herein.

Some examples of the deposition gases which may be used or adapted for use in at least one embodiment of the present invention may be found in the following U.S. Pat. No. 4,605,941, issued to Ovshinsky, et al. on Aug. 12, 1986 and entitled, "Amorphous semiconductors equivalent to crystalline semiconductors"; U.S. Pat. No. 4,676,967, issued to Breneman on Jun. 30, 1987 and entitled, "High purity silane and silicon production"; U.S. Pat. No. 4,678,679, issued to Ovshinsky on Jul. 7, 1987 and entitled, "Continuous deposition of activated process gases"; U.S. Pat. No. 4,818,495, issued to Iya on Apr. 4, 1989 and entitled, "Reactor for fluidized bed silane decomposition"; U.S. Pat. No. 5,380,372, issued to Campe, et al on Jan. 10, 1995 and entitled, "Solar cell and method for manufacture thereof"; U.S. Pat. No. 6,040,022, issued to Chang, et al. on Mar. 21, 2000 and entitled, "PECVD of compounds of silicon from silane and nitrogen"; U.S. Pat. No. 6,103,942, issued to Tsuo, et al. on Aug. 15, 2000 and entitled, "Method of high purity silane preparation"; and U.S. Pat. No. 6,323,142, issued to Yamazaki, et al. on Nov. 27, 2001 and entitled, "APCVD method of forming silicon oxide using an organic silane, oxidizing agent, and a catalyst-formed hydrogen radical". The foregoing patents are hereby incorporated by reference as if set forth in their entirety herein.

Some examples of the treatment gases comprising a hydrogen plasma which may be used or adapted for use in at least one embodiment of the invention may be found in the following U.S. Pat. No. 6,173,673, issued to Golovato, et al. on Jan. 16, 2001 and entitled, "Method an apparatus for insulating a high power RF electrode through which plasma discharge gases are injected into a processing chamber"; U.S. Pat. No. 6,200,412, issued to Kilgore, et al. on Mar. 13, 2001 and entitled, "Chemical vapor deposition system including dedicated cleaning gas injection"; U.S. Pat. No. 6,258,173, issued to Kirimura, et al. on Jul. 10, 2001 and entitled, "Film forming apparatus for forming a crystalline silicon film"; U.S. Pat. No. 6,296,735, issued to Marxer, et al. on Oct. 2, 2001 and entitled, "Plasma treatment apparatus and method for operation same"; U.S. Pat. No. 6,297,442, issued to Yagi, et al. on Oct. 2, 2001 and entitled, "Solar cell, self-power-supply display device using same, and process for producing solar cell"; and U.S. Pat. No. 6,287,944, issued to Hara, et al. on Sep. 11, 2001 and entitled, "Polycrystalline semiconductor device and its manufacture method". The foregoing patents are hereby incorporated by reference as if set forth in their entirety herein.

All of the references and documents, cited in any of the documents cited herein, and the references they are in turn cited in are hereby incorporated by reference as if set forth in their entirety herein. All of the documents cited herein, referred to in the immediately preceding sentence, include all of the patents, patent applications and publications cited anywhere in the present application.

All of the references included herein as aforesaid include the corresponding equivalents published by the United States Patent and Trademark Office and elsewhere.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clauses are intended to cover the structures described herein as performing the recited function and not only structural equivalents but also equivalent structures.

One feature of the invention resides broadly in a thin-film solar cell (18), comprising:

a transparent substrate (10) having a first surface configured to receive incident light and a second surface opposite said first surface;

a first electrode (12) having a first surface and a second surface opposite said first surface;

said first electrode (12) comprising an electrically conductive layer of a transparent conductive material;

a microcrystalline hydrogenated silicon semiconductor body (16);

said microcrystalline hydrogenated silicon semiconductor body (16) having a first surface and a second surface opposite said first surface;

said microcrystalline hydrogenated silicon semiconductor body (16) being disposed with said first surface thereof on said second surface of said first electrode (12);

said microcrystalline hydrogenated silicon semiconductor body (16) originated from a continuous-gas-flow, pulsed-electromagnetic-radiation-excited plasma, plasma-enhanced chemical vapor deposited, continuous-gas-flow, pulsed-electromagnetic-radiation-excited, hydrogen-plasma-enhanced-treated amorphous hydrogenated silicon body;

said second surface of said first electrode (12) comprising a surface configured to accept said microcrystalline hydrogenated silicon semiconductor body (16);

said microcrystalline hydrogenated silicon semiconductor body (16) comprising at least one semiconductor layer (13, 14, 15);

at least one of each said at least one semiconductor layer (13, 14, 15) having a thickness of from about one tenth of a nanometer to about fifty nanometers;

a second electrode (17) having a first surface and a second surface opposite said first surface;

said second electrode (17) being disposed with said first surface thereof on said second surface of said microcrystalline hydrogenated silicon semiconductor body (16);

a first conductor element (20) connected to said first electrode (12); and a second conductor element (22) connected to said second electrode (17);

said first conductor element (20) and said second conductor element (22) being configured and disposed to lead electricity from said solar cell (18);

said substrate (10) having a predetermined heat stability;

said predetermined heat stability being sufficiently great to permit manufacture of a thin-film solar cell (18) and said predetermined heat stability being sufficiently low to minimize cost.

Another feature of the invention resides broadly in the thin-film solar cell wherein:

said substrate (10) comprises one of: a glass, a glass ceramic, or a plastic.

Yet another feature of the invention resides broadly in the thin-film solar cell wherein:

said transparent conductive material of said first electrode (12) comprises one of: an indium-tin-oxide, a doped tin dioxide film, or a doped zinc oxide film.

Still another feature of the invention resides broadly in the thin-film solar cell wherein:

said amorphous hydrogenated silicon body comprises a plurality of layers;

said plurality of layers comprises from one to fifty amorphous hydrogenated silicon layers deposited on said second surface of said substrate;

at least the first amorphous hydrogenated silicon layer comprises a concentration of inherent microcrystalline hydrogenated silicon; said first amorphous hydrogenated silicon layer having a first surface disposed on said second surface of said substrate, and said first amorphous hydrogenated silicon layer having a second surface opposite said first surface; said concentration of inherent microcrystalline hydrogenated silicon increasing from said first surface of said first layer to said second surface of said first layer;

said microcrystalline hydrogenated silicon body has a thickness of up to about five thousand nanometers;

at least one microcrystalline hydrogenated silicon layer has a conductivity in the range of from about one tenth microsiemens per centimeter to about ten siemens per centimeter.

A further feature of the invention resides broadly in a thin-film transistor, comprising:

a substrate (30) having a first surface and a second surface opposite said first surface;

a microcrystalline hydrogenated silicon semiconductor body (32);

said microcrystalline hydrogenated silicon semiconductor body (32) having a first surface and a second surface opposite said first surface;

said microcrystalline hydrogenated silicon semiconductor body (32) being disposed with said first surface thereof on said second surface of said substrate (30);

said microcrystalline hydrogenated silicon semiconductor body (32) originated from a continuous-gas-flow, pulsed-electromagnetic-radiation-excited plasma, plasma-enhanced chemical vapor deposited, continuous-gas-flow, pulsed-electromagnetic-radiation-excited, hydrogen-plasma-enhanced-treated amorphous hydrogenated silicon body;

said microcrystalline hydrogenated silicon semiconductor body (32) comprising at least one semiconductor layer;

at least one of each said at least one semiconductor layer having a thickness of from about one tenth of a nanometer to about fifty nanometers;

said microcrystalline hydrogenated silicon semiconductor body (32) comprising a source layer (34) and a drain layer (36);

a plurality of insulating films (38, 40, 42) disposed on said microcrystalline hydrogenated silicon semiconductor body (32);

said plurality of insulating films (38, 40, 42) comprising a first insulating film (38), a second insulating film (40), and a third insulating film (42);

a gate electrode (44) disposed on said first insulating film (38);

a source electrode (46) disposed on said second insulating film (40);

a drain electrode (48) disposed on said third insulating film (42);

said substrate (30) comprising a predetermined heat stability;

said predetermined heat stability being sufficiently great to permit manufacture of a thin-film transistor and said predetermined heat stability being sufficiently low to minimize cost.

Another feature of the invention resides broadly in the thin-film transistor wherein:

said substrate (30) comprises one of: a glass, a glass ceramic, or a plastic.

Yet another feature of the invention resides broadly in the thin-film transistor wherein:

said amorphous hydrogenated silicon body comprises a plurality of layers;

said plurality of layers comprises from one to fifty amorphous hydrogenated silicon layers deposited on said second surface of said substrate;

at least the first amorphous hydrogenated silicon layer comprises a concentration of inherent microcrystalline hydrogenated silicon; said first amorphous hydrogenated silicon layer having a first surface disposed on said second surface of said substrate, and said first amorphous hydrogenated silicon layer having a second surface opposite said first surface; said concentration of inherent microcrystalline hydrogenated silicon increasing from said first surface of said first layer to said second surface of said first layer;

said microcrystalline hydrogenated silicon body has a thickness of up to about five thousand nanometers;

at least one microcrystalline hydrogenated silicon layer has a conductivity in the range of from about one tenth microsiemens per centimeter to about ten siemens per centimeter.

Still another feature of the invention resides broadly in a process for providing a microcrystalline hydrogenated silicon semiconductor body on a substrate, such as, a substrate for a thin-film solar cell, or a substrate for a thin-film transistor, said process comprising:

providing a substrate (10, 30), said substrate having a first surface and a second surface opposite said first surface;

flowing a plasma-enhanced chemical vapor deposition gas over said second surface of said substrate to deposit a body of amorphous hydrogenated silicon on said second surface of said substrate;

flowing a plasma-enhanced, hydrogen-plasma containing conversion gas over said deposited body of amorphous hydrogenated silicon to convert said deposited body of amorphous hydrogenated silicon into a body of microcrystalline hydrogenated silicon (16,32);

said flowing of said deposition gas and said flowing of said conversion gas comprising at least one of: (a.), (b.), (c.), and (d.):

(a.) continuously flowing said plasma-enhanced chemical vapor deposition gas over said second surface of said substrate (10, 30) to deposit said body of amorphous hydrogenated silicon on said second surface of said substrate;

(b.) continuously flowing said plasma-enhanced, hydrogen-plasma containing conversion gas over said body of amorphous hydrogenated silicon to convert said deposited body of amorphous hydrogenated silicon into a body of microcrystalline hydrogenated silicon (16, 32);

(c.) exposing said plasma-enhanced chemical vapor deposition gas to a pulsed electromagnetic radiation with a sufficient radiation intensity to excite said plasma contained in said plasma-enhanced chemical vapor deposition gas thus depositing said deposited body of amorphous hydrogenated silicon on said second surface of said substrate;

(d.) exposing said plasma-enhanced, hydrogen-plasma conversion gas to a pulsed electromagnetic radiation with a sufficient radiation intensity to excite said plasma contained in said plasma-enhanced, hydrogen-plasma conversion gas to thus effectuate conversion of said amorphous hydrogenated silicon body into said deposited body of microcrystalline hydrogenated silicon (16, 32);

and said method further comprising:

attaching at least two electrode means to said body of microcrystalline hydrogenated silicon and forming one of: a thin-film solar cell, or a thin-film transistor.

A further feature of the invention resides broadly in the process wherein:

said substrate (10, 30) comprises a predetermined heat stability;

said predetermined heat stability being sufficiently great to permit manufacture of a thin-film solar cell and said predetermined heat stability being sufficiently low to minimize cost.

Another feature of the invention resides broadly in the process wherein:

said depositing of said amorphous hydrogenated silicon comprises depositing a plurality of layers to form said body of amorphous hydrogenated silicon;

said plurality of layers comprises from one to fifty amorphous hydrogenated silicon layers deposited on said second surface of said substrate (10, 30).

Yet another feature of the invention resides broadly in the process wherein:

Yet another feature of the invention resides broadly in the process wherein:

at least the first amorphous hydrogenated silicon layer is deposited to comprise a concentration of inherent microcrystalline hydrogenated silicon;

said first amorphous hydrogenated silicon layer having a first surface disposed on said second surface of said substrate, and said first amorphous hydrogenated silicon layer having a second surface opposite said first surface;

said concentration of inherent microcrystalline hydrogenated silicon increasing from said first surface of said first layer to said second surface of said first layer.

Still another feature of the invention resides broadly in the process wherein:

at least one amorphous hydrogenated silicon layer is deposited with a thickness of from about one tenth of a nanometer to about five nanometers.

A further feature of the invention resides broadly in the process according comprising:

applying said plasma-enhanced, hydrogen-plasma conversion gas for a period of one of: up to about ten seconds, and less than about thirty seconds;

exposing said plasma to electromagnetic radiation for a period of time equal to or greater than one tenth of a millisecond;

said pulsed electromagnetic radiation of said plasma comprises sequential pulses, with the period of time between two pulses is at least two hundred milliseconds.

Another feature of the invention resides broadly in the process comprising:

depositing a microcrystalline hydrogenated silicon body (16, 32) having a thickness of up to about five thousand nanometers.

Yet another feature of the invention resides broadly in the process wherein:

said electromagnetic radiation comprises a microwave radiation;

said microwave radiation having a frequency of about two and forty-five hundredths gigahertz;

said microwave radiation having a mean microwave power of from about one hundred and fifty milliwatts per square centimeter to about fifteen hundred milliwatts per square centimeter.

Still another feature of the invention resides broadly in the process wherein:

said deposition gas contains at least one Si-organic film-forming agent;

said deposition gas comprises one of: a silane, $SiH_4$, or a chlorosilane;

said deposition gas additionally comprises hydrogen.

A further feature of the invention resides broadly in the process wherein:

at least said deposition gas has a pressure of from about one tenth millibar to about one millibar;

said deposition gas is evacuated and said conversion gas is introduced within about ten milliseconds.

Another feature of the invention resides broadly in the process comprising:

maintaining the substrate temperature during said depositing of said amorphous hydrogenated silicon body and during said converting of said amorphous hydrogenated silicon body into said microcrystalline silicon body at a temperature of one of: not exceeding two hundred degrees Celsius, approximately one hundred degrees Celsius, and fifty degrees Celsius.

Yet another feature of the invention resides broadly in the process comprising:

setting a conductivity of one microcrystalline hydrogenated silicon layer to a value in the range of from about one tenth microsiemens per centimeter to about ten siemens per centimeter by the introduction of doped atoms contained in said deposition gas.

Still another feature of the invention resides broadly in the process wherein:

said substrate (10, 30) comprises one of: a glass, a glass ceramic, or a plastic.

One feature of the invention resides broadly in the process comprising:

applying a transparent conductive film on said second surface of said substrate;

said transparent conductive film comprises one of: an indium-tin-oxide, a doped tin dioxide film, or a doped zinc oxide film.

Another feature of the invention resides broadly in the process wherein:

said process comprises a deposition chamber (50) in which to deposit said amorphous hydrogenated body and to convert said amorphous hydrogenated silicon body into said microcrystalline hydrogenated silicon body;

said deposition chamber comprising inner surfaces;

said process comprising:

depositing at least one amorphous hydrogenated silicon layer on said inner surfaces of said deposition chamber prior to applying said conversion gas to an amorphous hydrogenated silicon layer.

The details in the patents, patent applications and publications may be considered to be incorporable, at applicant's option, into the claims during prosecution as further limitations in the claims to patentably distinguish any amended claims from any applied prior art.

The invention as described hereinabove in the context of the preferred embodiments is not to be taken as limited to all of the provided details thereof, since modifications and variations thereof may be made without departing from the spirit and scope of the invention.

What is claimed is:

1. A method of forming a microcrystalline hydrogenated silicon body on a substrate, said method comprising the steps of:

flowing a chemical vapor coating gas comprising hydrogen and silicon over said substrate and exciting said coating gas with at least one pulse of electromagnetic radiation and depositing at least one film of amorphous hydrogenated silicon on said substrate;

flowing a hydrogen treatment gas over said substrate and exciting said treatment gas with another at least one pulse of electromagnetic radiation to form hydrogen plasma after deposition of said at least one amorphous hydrogenated silicon film, and transforming said at least one amorphous hydrogenated silicon film with said hydrogen plasma into a film of microcrystalline hydrogenated silicon; and immediately switching said flow of said coating gas to said flow of said treatment gas to form a continuous flow of gas over said substrate.

2. The method according to claim 1, wherein said step of depositing comprises depositing at least one film of amorphous hydrogenated silicon comprising 1 to 50 amorphous hydrogenated silicon monolayers.

3. The method according to claim 2, wherein at least the first monolayer deposited on the substrate is in the form of a degressive gradient with an elevated, inherent microcrystalline hydrogenated silicon fraction.

4. The method according to claim 3, wherein said step of depositing comprises depositing at least one film of amorphous hydrogenated silicon having a thickness in the range of 0.1 to 5 nm.

5. The method according to claim 4, wherein said step of transforming comprises treating said at least one amorphous hydrogenated silicon film with said hydrogen plasma for an amount of time in the range of one of:

up to 30 seconds; and up to 10 seconds.

6. The method according to claim 5, wherein said step of exciting said treatment gas comprises exciting said treatment gas with a pulse of electromagnetic radiation of $\geq 0.1$ ms.

7. The method according to claim 6, wherein said method further comprises pausing between two pulses of said electromagnetic radiation when exciting said treatment gas, which pause is $\leq 200$ ms.

8. The method according to claim 7, wherein said method further comprises forming a microcrystalline hydrogenated silicon body having a thickness of up to 5000 nm on said substrate.

9. The method according to claim 8, wherein said method further comprises exciting said treatment gas by microwave radiation having an excitation frequency of 2.45 GHz and a mean microwave power in the range of 150 mW/cm$^3$ to 1500 mW/cm$^3$.

10. The method according to claim 9, wherein:

said chemical vapor comprises a coating gas which contains at least one Si-organic film-forming agent; and said coating gas is a silane gas which comprises SiH$_4$ or a chlorosilane.

11. The method according to claim 10, wherein said method further comprises setting a process pressure of from 0.1 to 1 mbar.

12. The method according to claim 11, wherein the temperature of said substrate during said method is one of:

less than 200° C.;

less than 100° C.; and less than 50° C.

13. The method according to claim 12, wherein said method further comprises:

setting conductivities of said microcrystalline hydrogenated silicon film of from 10$^{-7}$ S/cm to 10 S/cm; and using a substrate which is made from a glass, a glass ceramic or a plastic, and which is provided with a transparent, conductive film comprising one of: an ITO film, a doped SnO$_2$ film, and a doped ZnO film.

14. The method according to claim 1, further comprising the steps of:

attaching a first electrode to said substrate; and attaching a second electrode to said microcrystalline hydrogenated silicon.

15. The method according to claim 1, further comprising the step of attaching a gate electrode, a source electrode, and a drain electrode to said microcrystalline hydrogenated silicon.

16. The method according to claim 1, further comprising repeating the steps of:

flowing a chemical vapor coating gas comprising hydrogen and silicon over said substrate and exciting said coating gas with at least one pulse of electromagnetic radiation and depositing at least one film of amorphous hydrogenated silicon on said substrate;

flowing a hydrogen treatment gas over said substrate and exciting said treatment gas with another at least one pulse of electromagnetic radiation to form hydrogen plasma after deposition of said at least one amorphous hydrogenated silicon film, and transforming said at least one amorphous hydrogenated silicon film with said hydrogen plasma into a film of microcrystalline hydrogenated silicon; and immediately switching said flow of said coating gas to said flow of said treatment gas to form a continuous flow of gas over asid substrate.

17. The method according to claim 16, wherein said step of transforming comprises treating said at least one amorphous hydrogenated silicon film with said hydrogen plasma for an amount of time in the range of one of:
    up to 30 seconds; and
    up to 10 seconds.

18. The method according to claim 17, wherein:
    said step of exciting said treatment gas comprises exciting said treatment gas with a pulse of electromagnetic radiation of $\leq 0.1$ ms;
    said method further comprises pausing between two pulses of said electromagnetic radiation when exciting said treatment gas, which pause is $\leq 200$ ms; and
    said method further comprises forming a microcrystalline hydrogenated silicon body having a thickness of up to 5000 nm on said substrate.

19. The method according to claim 18, wherein:
    said method further comprises exciting said treatment gas by microwave radiation having an excitation frequency of 2.45 GHz and a mean microwave power in the range of 150 mW/cm$^3$ to 1500 m/Wcm$^3$;
    said chemical vapor comprises a coating gas which contains at least one Si-organic film-forming agent;
    said coating gas is a silane gas which comprises SiH$_4$ or a chlorosilane; and
    setting a process pressure of from 0.1 to mbar.

20. The method according to claim 19, wherein:
    the temperature of said substrate during said method is one of:
    less than 200° C.;
    less than 100° C.; and
    less than 50° C.; and
    said method further comprises:
        setting conductivities of said microcrystalline hydrogenated silicon film of from 10$^{-7}$ S/cm to 10 S/cm; and
    using a substrate which is made from a glass, a glass ceramic or a plastic, and which is provided with a transparent, conductive film comprising one of: an ITO film, a doped SnO$_2$ film, and a doped ZnO film.

* * * * *

UNITED STATES PATENT AND TRADEMARK OFFICE
CERTIFICATE OF CORRECTION

PATENT NO. : 7,041,342 B2
APPLICATION NO. : 10/683088
DATED : May 9, 2006
INVENTOR(S) : Manfred Lohmeyer et al.

Page 1 of 1

It is certified that error appears in the above-identified patent and that said Letters Patent is hereby corrected as shown below:

Column 25, delete lines 63 and 64, in their entirety.

Column 29, line 3, Claim 16, after "over", delete "asid" and insert --said--.

Column 29, line 13, Claim 18, after "of", delete "$\leqq 0.1$" and inset --$\geq 0.1$--.

Column 29, line 24, Claim 19, after "1500", delete "m/W" and insert --mW/--.

Column 30, line 6, after "to" insert --1--.

Signed and Sealed this

Twelfth Day of December, 2006

JON W. DUDAS
*Director of the United States Patent and Trademark Office*